US012770839B2

(12) United States Patent
Linebarger, Jr. et al.

(10) Patent No.: US 12,770,839 B2
(45) Date of Patent: Oct. 20, 2026

(54) MULTI-STATION PROCESSING TOOLS WITH STATION-VARYING SUPPORT FEATURES FOR BACKSIDE PROCESSING

(71) Applicant: Lam Research Corporation, Fremont, CA (US)

(72) Inventors: Nick Ray Linebarger, Jr., Beaverton, OR (US); Fayaz A. Shaikh, Lake Oswego, OR (US); Arul N. Dhas, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 813 days.

(21) Appl. No.: 18/002,289

(22) PCT Filed: Jun. 21, 2021

(86) PCT No.: PCT/US2021/038215
§ 371 (c)(1),
(2) Date: Dec. 19, 2022

(87) PCT Pub. No.: WO2021/262585
PCT Pub. Date: Dec. 30, 2021

(65) Prior Publication Data

US 2023/0352279 A1 Nov. 2, 2023

Related U.S. Application Data

(60) Provisional application No. 62/705,411, filed on Jun. 25, 2020.

(51) Int. Cl.
*H01J 37/32* (2006.01)
*C23C 16/455* (2006.01)
(Continued)

(52) U.S. Cl.
CPC .. *H01J 37/32715* (2013.01); *C23C 16/45565* (2013.01); *C23C 16/45597* (2013.01);
(Continued)

(58) Field of Classification Search
CPC ........ C23C 16/45565; C23C 16/45597; C23C 16/4585; C23C 16/5096; H01J 37/32715;
(Continued)

(56) References Cited

U.S. PATENT DOCUMENTS

| | | | |
|---|---|---|---|
| 4,892,753 | A | 1/1990 | Wang et al. |
| 4,951,603 | A | 8/1990 | Yoshino et al. |

(Continued)

FOREIGN PATENT DOCUMENTS

| | | | |
|---|---|---|---|
| CN | 1739864 | A | 3/2006 |
| CN | 1830069 | A | 9/2006 |

(Continued)

OTHER PUBLICATIONS

CN Notice of Allowances dated Aug. 22, 2024 in CN Application No. 202210991402.7 with English translation.

(Continued)

*Primary Examiner* — Charlee J. C. Bennett
(74) *Attorney, Agent, or Firm* — Weaver Austin Villeneuve & Sampson LLP

(57) ABSTRACT

Multi-station processing tools with station-varying support features for backside processing are provided. The support features in a first station may hold a wafer at a first set of points during backside deposition, blocking backside deposition, etching, or other processing at those points. The support features in a second station may hold a wafer at a second set of points that don't overlap with the first set of points.

16 Claims, 7 Drawing Sheets

(51) Int. Cl.
*C23C 16/458* (2006.01)
*C23C 16/509* (2006.01)
*H10P 14/60* (2026.01)

(52) U.S. Cl.
CPC ...... *C23C 16/4585* (2013.01); *C23C 16/5096* (2013.01); *H01J 37/32403* (2013.01); *H01J 37/32743* (2013.01); *H01J 37/32788* (2013.01); *H01J 37/32899* (2013.01); *H10P 14/6336* (2026.01); *H01J 2237/332* (2013.01)

(58) Field of Classification Search
CPC ........... H01J 37/32403; H01J 37/32743; H01J 37/32788; H01J 37/32899; H01J 2237/332; H01L 21/02274
USPC .......................................................... 118/719
See application file for complete search history.

(56) References Cited

U.S. PATENT DOCUMENTS

| | | | |
|---|---|---|---|
| 5,000,113 | A | 3/1991 | Wang et al. |
| 5,074,017 | A | 12/1991 | Toya et al. |
| 5,242,539 | A | 9/1993 | Kumihashi et al. |
| 5,338,363 | A | 8/1994 | Kawata et al. |
| 5,651,867 | A | 7/1997 | Kokaku et al. |
| 5,789,028 | A | 8/1998 | Zhao et al. |
| 5,792,269 | A | 8/1998 | Deacon et al. |
| 5,888,304 | A | 3/1999 | Umotoy et al. |
| 5,964,952 | A | 10/1999 | Kunze-Concewitz |
| 5,981,899 | A | 11/1999 | Perrin et al. |
| 6,017,396 | A | 1/2000 | Okamoto |
| 6,111,225 | A | 8/2000 | Ohkase et al. |
| 6,113,698 | A | 9/2000 | Raaijmakers et al. |
| 6,153,012 | A | 11/2000 | Rupp et al. |
| 6,170,496 | B1 | 1/2001 | Chen et al. |
| 6,179,924 | B1 | 1/2001 | Zhao et al. |
| 6,183,565 | B1 | 2/2001 | Granneman et al. |
| 6,245,192 | B1 | 6/2001 | Dhindsa et al. |
| 6,251,191 | B1 | 6/2001 | Matsuse |
| 6,279,506 | B1 | 8/2001 | Jurgensen et al. |
| 6,329,304 | B1 | 12/2001 | Kuznetsov et al. |
| 6,461,439 | B1 | 10/2002 | Granneman et al. |
| 6,565,661 | B1 | 5/2003 | Nguyen |
| 6,613,685 | B1 | 9/2003 | Granneman et al. |
| 6,746,237 | B2 | 6/2004 | Storm et al. |
| 6,788,991 | B2 | 9/2004 | De Haas et al. |
| 6,800,187 | B1 | 10/2004 | Reid et al. |
| 6,805,749 | B2 | 10/2004 | Granneman et al. |
| 6,940,047 | B2 | 9/2005 | Van et al. |
| 6,964,751 | B2 | 11/2005 | Storm et al. |
| 7,022,627 | B2 | 4/2006 | Granneman et al. |
| 7,033,444 | B1 | 4/2006 | Komino et al. |
| 7,153,772 | B2 | 12/2006 | Granneman et al. |
| 7,217,670 | B2 | 5/2007 | Van Kesteren |
| 7,312,156 | B2 | 12/2007 | Granneman et al. |
| 7,410,355 | B2 | 8/2008 | Granneman et al. |
| 7,534,977 | B2 | 5/2009 | Yamazaki |
| 7,691,750 | B2 | 4/2010 | Granneman et al. |
| 7,754,013 | B2 | 7/2010 | Granneman |
| 7,858,898 | B2 | 12/2010 | Bailey, III et al. |
| 7,927,455 | B2 | 4/2011 | Kishimoto et al. |
| 7,943,007 | B2 | 5/2011 | Bailey, III et al. |
| 8,092,640 | B2 | 1/2012 | Kishimoto et al. |
| 8,101,531 | B1 | 1/2012 | Li et al. |
| 8,133,322 | B2 | 3/2012 | Nakamura et al. |
| 8,137,465 | B1 | 3/2012 | Shrinivasan et al. |
| 8,147,648 | B2 | 4/2012 | Dhindsa |
| 8,308,931 | B2 | 11/2012 | Reid et al. |
| 8,349,196 | B2 | 1/2013 | Fairbairn et al. |
| 8,373,086 | B2 | 2/2013 | Kim et al. |
| 8,562,750 | B2 | 10/2013 | Chen et al. |
| 8,580,078 | B2 | 11/2013 | Bailey, III et al. |
| 8,701,268 | B2 | 4/2014 | Larson et al. |
| 8,721,908 | B2 | 5/2014 | Bailey, III et al. |
| 8,728,956 | B2 | 5/2014 | Lavoie et al. |
| 8,784,622 | B2 | 7/2014 | Barnes et al. |
| 8,888,950 | B2 | 11/2014 | Lee et al. |
| 8,956,456 | B2 | 2/2015 | Vermeer et al. |
| 9,017,526 | B2 | 4/2015 | Singh et al. |
| 9,165,587 | B2 | 10/2015 | Barnes et al. |
| 9,175,391 | B2 | 11/2015 | Endo et al. |
| 9,238,867 | B2 | 1/2016 | Granneman et al. |
| 9,243,330 | B2 | 1/2016 | Granneman et al. |
| 9,245,761 | B2 | 1/2016 | Singh et al. |
| 9,273,392 | B2 | 3/2016 | Vermeer et al. |
| 9,328,416 | B2 | 5/2016 | Dhas et al. |
| 9,449,808 | B2 | 9/2016 | Buckalew et al. |
| 9,644,271 | B1 | 5/2017 | Keil et al. |
| 9,776,905 | B2 | 10/2017 | Maschmeyer et al. |
| 9,870,917 | B2 | 1/2018 | Kang et al. |
| 9,881,788 | B2 | 1/2018 | Kim et al. |
| 10,109,517 | B1 | 10/2018 | Blank et al. |
| 10,233,111 | B2 | 3/2019 | Lezzi et al. |
| 10,358,722 | B2 | 7/2019 | Wiltse et al. |
| 10,611,664 | B2 | 4/2020 | Lezzi et al. |
| 10,851,457 | B2 | 12/2020 | Shaikh et al. |
| 10,900,122 | B2 | 1/2021 | Shugrue et al. |
| 10,954,597 | B2 | 3/2021 | De Ridder et al. |
| 11,097,974 | B2 | 8/2021 | Lezzi et al. |
| 11,441,222 | B2 | 9/2022 | Shaikh et al. |
| 11,725,283 | B2 | 8/2023 | Shaikh et al. |
| 11,851,760 | B2 | 12/2023 | Shaikh et al. |
| 11,946,142 | B2 | 4/2024 | Shaikh et al. |
| 12,338,531 | B2 | 6/2025 | Shaikh et al. |
| 2001/0004479 | A1 | 6/2001 | Cheung et al. |
| 2002/0036343 | A1 | 3/2002 | Moriya et al. |
| 2002/0062792 | A1 | 5/2002 | Boydston et al. |
| 2003/0091870 | A1 | 5/2003 | Bhowmik et al. |
| 2003/0209323 | A1 | 11/2003 | Yokogaki |
| 2004/0003777 | A1 | 1/2004 | Carpenter et al. |
| 2004/0005211 | A1 | 1/2004 | Lowrance et al. |
| 2004/0035358 | A1 | 2/2004 | Basceri et al. |
| 2004/0082251 | A1 | 4/2004 | Bach et al. |
| 2004/0087168 | A1 | 5/2004 | Granneman et al. |
| 2004/0134611 | A1 | 7/2004 | Kato et al. |
| 2004/0142558 | A1 | 7/2004 | Granneman |
| 2004/0190215 | A1 | 9/2004 | Weldon et al. |
| 2005/0022740 | A1 | 2/2005 | Hatano |
| 2005/0037619 | A1 | 2/2005 | Granneman et al. |
| 2005/0103267 | A1 | 5/2005 | Hur et al. |
| 2005/0109460 | A1 | 5/2005 | DeDontney et al. |
| 2005/0148139 | A1 | 7/2005 | Sashida |
| 2005/0183789 | A1 | 8/2005 | Hong |
| 2005/0223982 | A1 | 10/2005 | Park et al. |
| 2006/0110944 | A1 | 5/2006 | Kesteren |
| 2006/0137609 | A1* | 6/2006 | Puchacz .............. H10P 72/0454 118/719 |
| 2006/0219362 | A1 | 10/2006 | Han et al. |
| 2006/0264063 | A1 | 11/2006 | Stern et al. |
| 2007/0015374 | A1 | 1/2007 | Granneman |
| 2007/0034479 | A1 | 2/2007 | Todaka |
| 2007/0095286 | A1 | 5/2007 | Baek et al. |
| 2007/0163996 | A1 | 7/2007 | Horiguchi |
| 2007/0193688 | A1 | 8/2007 | Dhindsa et al. |
| 2008/0026162 | A1 | 1/2008 | Dickey et al. |
| 2008/0066684 | A1* | 3/2008 | Patalay ............. H01L 21/68735 118/728 |
| 2008/0069951 | A1 | 3/2008 | Chacin et al. |
| 2008/0073324 | A1 | 3/2008 | Nogami et al. |
| 2008/0152838 | A1 | 6/2008 | Sen et al. |
| 2008/0179010 | A1 | 7/2008 | Bailey, III et al. |
| 2009/0000550 | A1 | 1/2009 | Tran et al. |
| 2009/0008035 | A1 | 1/2009 | Iwai |
| 2009/0011120 | A1 | 1/2009 | Iwai |
| 2009/0071407 | A1 | 3/2009 | Kuznetsov |
| 2009/0095220 | A1 | 4/2009 | Meinhold et al. |
| 2009/0096349 | A1 | 4/2009 | Moshtagh et al. |
| 2009/0145752 | A1 | 6/2009 | Barnes et al. |
| 2009/0145879 | A1 | 6/2009 | Fairbairn et al. |
| 2009/0145881 | A1 | 6/2009 | Barnes et al. |
| 2009/0241833 | A1 | 10/2009 | Moshtagh et al. |
| 2009/0275210 | A1 | 11/2009 | Shanker et al. |
| 2009/0291209 | A1 | 11/2009 | Granneman et al. |

(56) References Cited

U.S. PATENT DOCUMENTS

| | | | |
|---|---|---|---|
| 2009/0311869 A1 | 12/2009 | Okesaku et al. | |
| 2010/0059478 A1 | 3/2010 | Lee et al. | |
| 2010/0116209 A1 | 5/2010 | Kato | |
| 2010/0193915 A1 | 8/2010 | Kishimoto et al. | |
| 2010/0270004 A1 | 10/2010 | Landess et al. | |
| 2010/0314725 A1 | 12/2010 | Gu et al. | |
| 2011/0024399 A1 | 2/2011 | Kim et al. | |
| 2011/0034034 A1 | 2/2011 | Du Bois et al. | |
| 2011/0049100 A1 | 3/2011 | Han et al. | |
| 2011/0100955 A1 | 5/2011 | Pushparaj et al. | |
| 2011/0212625 A1 | 9/2011 | Toyoda et al. | |
| 2011/0223334 A1 | 9/2011 | Yudovsky et al. | |
| 2011/0232571 A1 | 9/2011 | Hiura et al. | |
| 2011/0244690 A1 | 10/2011 | Shanker et al. | |
| 2011/0268879 A1 | 11/2011 | Granneman et al. | |
| 2011/0308551 A1 | 12/2011 | Chung et al. | |
| 2012/0090992 A1 | 4/2012 | Fairbairn et al. | |
| 2012/0097641 A1 | 4/2012 | Beckmann et al. | |
| 2012/0108066 A1 | 5/2012 | New et al. | |
| 2012/0196050 A1 | 8/2012 | Vermeer et al. | |
| 2012/0222815 A1 | 9/2012 | Sabri et al. | |
| 2012/0295014 A1 | 11/2012 | Guyaux et al. | |
| 2012/0301616 A1 | 11/2012 | Endo et al. | |
| 2013/0098761 A1 | 4/2013 | Fairbairn et al. | |
| 2013/0183834 A1 | 7/2013 | Rogers et al. | |
| 2013/0199448 A1 | 8/2013 | Granneman et al. | |
| 2013/0228284 A1 | 9/2013 | Denpoh et al. | |
| 2014/0021673 A1 | 1/2014 | Chen et al. | |
| 2014/0030445 A1 | 1/2014 | Vermeer et al. | |
| 2014/0037847 A1 | 2/2014 | Vermeer et al. | |
| 2014/0038418 A1 | 2/2014 | Bailey, III et al. | |
| 2014/0044887 A1 | 2/2014 | Vermeer | |
| 2014/0199788 A1 | 7/2014 | Vermont et al. | |
| 2014/0252134 A1 | 9/2014 | Chen et al. | |
| 2014/0273409 A1 | 9/2014 | Pitney et al. | |
| 2014/0302681 A1 | 10/2014 | Paterson et al. | |
| 2015/0167167 A1 | 6/2015 | Vermeer et al. | |
| 2015/0228461 A1 | 8/2015 | Fukazawa et al. | |
| 2015/0340225 A1 | 11/2015 | Kim et al. | |
| 2016/0172165 A1 | 6/2016 | Jeon et al. | |
| 2016/0177444 A1 | 6/2016 | Baldasseroni et al. | |
| 2016/0289827 A1 | 10/2016 | Augustyniak et al. | |
| 2016/0319422 A1 | 11/2016 | Kurita et al. | |
| 2016/0340782 A1 | 11/2016 | Chandrasekharan et al. | |
| 2016/0362788 A1 | 12/2016 | Kurita et al. | |
| 2016/0376706 A1 | 12/2016 | Miller et al. | |
| 2017/0121819 A1 | 5/2017 | Swaminathan et al. | |
| 2017/0256393 A1 | 9/2017 | Kim et al. | |
| 2017/0275756 A1 | 9/2017 | Blaquiere et al. | |
| 2017/0345617 A1 | 11/2017 | Takeda | |
| 2018/0334746 A1 | 11/2018 | Breiling et al. | |
| 2019/0062918 A1* | 2/2019 | Shaikh | H01L 21/02216 |
| 2019/0078211 A1 | 3/2019 | Kuenle et al. | |
| 2019/0131145 A1 | 5/2019 | Tai et al. | |
| 2019/0145001 A1 | 5/2019 | Park et al. | |
| 2019/0148211 A1 | 5/2019 | Seo et al. | |
| 2020/0020563 A1 | 1/2020 | Nishida et al. | |
| 2020/0321193 A1 | 10/2020 | Ni et al. | |
| 2021/0079522 A1 | 3/2021 | Wu et al. | |
| 2021/0108314 A1 | 4/2021 | Shaikh et al. | |
| 2021/0166940 A1* | 6/2021 | Nozawa | H01L 21/67098 |
| 2021/0187521 A1 | 6/2021 | Mustafa et al. | |
| 2021/0214846 A1 | 7/2021 | Nandwana et al. | |
| 2021/0265134 A1 | 8/2021 | Singh et al. | |
| 2021/0301402 A1 | 9/2021 | Suzuki et al. | |
| 2021/0404064 A1 | 12/2021 | Dip | |
| 2021/0407843 A1 | 12/2021 | Yang et al. | |
| 2022/0136107 A1 | 5/2022 | Lee et al. | |
| 2022/0162753 A1 | 5/2022 | Shaikh et al. | |
| 2022/0162754 A1 | 5/2022 | Shaikh et al. | |
| 2022/0162755 A1 | 5/2022 | Shaikh et al. | |
| 2022/0298632 A1 | 9/2022 | Shaikh et al. | |
| 2023/0010049 A1 | 1/2023 | Vellanki et al. | |
| 2023/0238223 A1 | 7/2023 | Linebarger, Jr. et al. | |
| 2024/0096605 A1* | 3/2024 | Kotrappa | C23C 16/505 |
| 2024/0167161 A1 | 5/2024 | Shaikh et al. | |
| 2024/0309507 A1 | 9/2024 | Shaikh et al. | |
| 2025/0118592 A1 | 4/2025 | Linebarger, Jr. et al. | |
| 2025/0305128 A1 | 10/2025 | Lee et al. | |

FOREIGN PATENT DOCUMENTS

| | | | |
|---|---|---|---|
| CN | 1842240 | A | 10/2006 |
| CN | 101116167 | A | 1/2008 |
| CN | 101358337 | A | 2/2009 |
| CN | 101389415 | A | 3/2009 |
| CN | 101463473 | A | 6/2009 |
| CN | 101589456 | A | 11/2009 |
| CN | 101901752 | A | 12/2010 |
| CN | 101919041 | A | 12/2010 |
| CN | 102017083 | A | 4/2011 |
| CN | 102232243 | A | 11/2011 |
| CN | 102498558 | A | 6/2012 |
| CN | 102575348 | A | 7/2012 |
| CN | 103597113 | A | 2/2014 |
| CN | 103628045 | A | 3/2014 |
| CN | 103904155 | A | 7/2014 |
| CN | 104233232 | A | 12/2014 |
| CN | 104282530 | A | 1/2015 |
| CN | 104685095 | A | 6/2015 |
| CN | 104835712 | A | 8/2015 |
| CN | 105088177 | A | 11/2015 |
| CN | 105185727 | A | 12/2015 |
| CN | 105420685 | A | 3/2016 |
| CN | 105428194 | A | 3/2016 |
| CN | 105719989 | A | 6/2016 |
| CN | 106463344 | A | 2/2017 |
| CN | 106463453 | A | 2/2017 |
| CN | 106947958 | A | 7/2017 |
| CN | 107393800 | A | 11/2017 |
| CN | 109273378 | A | 1/2019 |
| CN | 109797376 | A | 5/2019 |
| CN | 215815786 | U | 2/2022 |
| EP | 0550058 | A2 | 7/1993 |
| EP | 1126047 | A1 | 8/2001 |
| JP | H0478130 | A | 3/1992 |
| JP | H0645266 | A | 2/1994 |
| JP | 2002208590 | A | 7/2002 |
| JP | 2003027242 | A | 1/2003 |
| JP | 2003115483 | A | 4/2003 |
| JP | 2007242858 | A | 9/2007 |
| JP | 2009088473 | A | 4/2009 |
| JP | 2011119472 | A | 6/2011 |
| JP | 2012089661 | A | 5/2012 |
| JP | 2012256895 | A | 12/2012 |
| JP | 2013021112 | A | 1/2013 |
| JP | 2013232670 | A | 11/2013 |
| JP | 2016219803 | A | 12/2016 |
| JP | 2018022685 | A | 2/2018 |
| KR | 20000070265 | A | 11/2000 |
| KR | 20020016706 | A | 3/2002 |
| KR | 100335282 | B1 | 7/2002 |
| KR | 20030083132 | A | 10/2003 |
| KR | 20050084807 | A | 8/2005 |
| KR | 20080018359 | A | 2/2008 |
| KR | 20080048243 | A | 6/2008 |
| KR | 20080084323 | A | 9/2008 |
| KR | 20080092766 | A | 10/2008 |
| KR | 20080100370 | A | 11/2008 |
| KR | 20090053331 | A | 5/2009 |
| KR | 20090106730 | A | 10/2009 |
| KR | 20090118676 | A | 11/2009 |
| KR | 20100122873 | A | 11/2010 |
| KR | 20110095908 | A | 8/2011 |
| KR | 20120105245 | A | 9/2012 |
| KR | 101258602 | B1 | 4/2013 |
| KR | 20140011364 | A | 1/2014 |
| KR | 20140067983 | A | 6/2014 |
| KR | 101423358 | B1 | 7/2014 |
| KR | 20150010669 | A | 1/2015 |
| KR | 20150090538 | A | 8/2015 |
| KR | 20150101785 | A | 9/2015 |
| KR | 101562192 | B1 | 10/2015 |
| KR | 101580511 | B1 | 12/2015 |

(56) References Cited

FOREIGN PATENT DOCUMENTS

| | | | |
|---|---|---|---|
| KR | 20150139774 | A | 12/2015 |
| KR | 20160072056 | A | 6/2016 |
| KR | 20160075351 | A | 6/2016 |
| KR | 20160117261 | A | 10/2016 |
| KR | 20180087153 | A | 8/2018 |
| KR | 20190056021 | A | 5/2019 |
| KR | 20190056030 | A | 5/2019 |
| KR | 20200060579 | A | 6/2020 |
| KR | 20200133493 | A | 11/2020 |
| KR | 102185623 | B1 | 12/2020 |
| KR | 20210073235 | A | 6/2021 |
| KR | 20230069200 | A | 5/2023 |
| TW | 200715403 | A | 4/2007 |
| TW | 200837875 | A | 9/2008 |
| TW | 200908136 | A | 2/2009 |
| TW | 200913108 | A | 3/2009 |
| TW | 200930826 | A | 7/2009 |
| TW | 201335997 | A | 9/2013 |
| TW | 201539617 | A | 10/2015 |
| TW | 201542860 | A | 11/2015 |
| TW | 201701318 | A | 1/2017 |
| WO | WO-9801890 | A1 | 1/1998 |
| WO | WO-2007023535 | A1 | 3/2007 |
| WO | WO-2012151830 | A1 | 11/2012 |
| WO | WO-2014030973 | A1 | 2/2014 |
| WO | WO-2019046134 | A1 | 3/2019 |
| WO | WO-2019055366 | A1 | 3/2019 |
| WO | WO-2020031778 | A1 | 2/2020 |
| WO | WO-2022060615 | A1 | 3/2022 |
| WO | WO-2022119732 | A1 | 6/2022 |

OTHER PUBLICATIONS

CN Notice of Allowances dated Jul. 18, 2024 in CN Application No. 202080012187 with English translation.
CN Office Action dated Apr. 9, 2024 in CN Application No. 202210991402.7, with English translation.
CN Office Action dated Aug. 1, 2024 in CN Application No. 202080058049.6 with English translation.
CN Office Action dated Dec. 1, 2023 in CN Application No. 202080058049.6 with English Translation.
CN Office Action dated Feb. 1, 2023 in Application No. CN202080012187 with English translation.
CN Office Action dated Jan. 11, 2024 in CN Application No. 202080012187, with English Translation.
CN Office Action dated Jun. 28, 2025 in CN Application No. 202080058049.6, with English Translation.
CN Office Action dated Mar. 29, 2025 in CN Application No. 202080058049.6, with English Translation.
CN Office Action dated Nov. 12, 2024 in CN Application No. 202080058049.6 with English translation.
CN Office Action dated Sep. 28, 2023, in application No. CN202080012187.0 with English translation.
International Preliminary Report on Patentability and Written Opinion dated Aug. 2, 2024 in PCT Application No. PCT/US2023/011056.
International Preliminary Report on Patentability and Written Opinion dated Aug. 12, 2021 in PCT Application No. PCT/US2020/013714.
International Search Report and Written Opinion dated Aug. 30, 2023, in Application No. PCT/US2023/021934.
International Search Report and Written Opinion dated Dec. 3, 2024 in PCT Application No. PCT/US2024/042531.
International Search Report and Written Opinion dated May 15, 2020 in PCT Application No. PCT/US2020/013714.
International Search Report and Written Opinion dated May 16, 2023 in PCT Application No. PCT/US2023/011056.
International Search Report and Written Opinion dated Sep. 20, 2023 in PCT Application No. PCT/US2023/021927.
JP Notice of Allowance dated Dec. 24, 2024 in JP Application No. 2022-579932 with English translation.
KR Notice of Preliminary Examination Report dated Jun. 12, 2023, in Application No. KR10-2023-7013677 with English translation.
KR Office Action dated Apr. 24, 2025 in KR Application No. 10-2023-7003165, with English Translation.
KR Office Action dated Aug. 18, 2023, in application No. KR 10-2023-7013677 with English translation.
KR Office Action dated Dec. 12, 2023 in KR Application No. 10-2023-7037869 with English translation.
KR Office Action dated Dec. 18, 2023, in application No. 10-2023-7022595 with English translation.
KR Office Action dated Dec. 26, 2024 in KR Application No. 10-2023-7022595, with English translation.
KR Office Action dated Dec. 27, 2023 in KR Application No. KR 10-2023-7013677 with English translation.
KR Office Action dated Feb. 4, 2024 in KR Application No. 10-2023-7037869 with English translation.
KR Office Action dated Jul. 10, 2024 in KR Application No. 10-2023-7038352 with English translation.
KR Office Action dated Jul. 29, 2024 in KR Application No. 10-2023-7003165, withEnglish translation.
KR Office Action dated Jul. 29, 2024 in KR Application No. 10-2023-7022595, with English translation.
KR Office Action dated Jul. 30, 2025 in KR Application No. 10-2021-7027749, with English Translation.
KR Office Action dated Jun. 12, 2024 in KR Application No. 10-2023-7001699 with English translation.
KR Office Action dated Jun. 19, 2023, in application No. KR 10-2022-0088448 with English translation.
KR Office Action dated May 28, 2024 in KR Application No. 10-2023-7013677, with English translation.
KR Office Action dated May 30, 2025 in KR Application No. 10-2023-7038352, with English Translation.
KR Office Action dated Nov. 23, 2024 in KR Application No. 10-2021-7027749 with English translation.
KR Office Action dated Oct. 27, 2022 in Application No. KR 10-2022-7020424 with English Translation.
KR Prior Art Search Report dated Nov. 9, 2023, in Application No. KR10-2023-7037869 with English translation.
KR Prior Art Search Report dated Nov. 14, 2023, in Application No. KR10-2023-7038352 with English translation.
KR Search Report dated Jul. 27, 2022 in Application No. KR10-2022-0088448 with English translation.
KR Search Report dated May 10, 2023, in Application No. KR10-2023-7013677 with English translation.
KR Search Report dated Oct. 13, 2023, in Application No. KR 10-2023-7022595 with English translation.
KR Trial Decision dated Jul. 18, 2025 in KR Application No. 10-2023-7013677, with English Translation.
TW Notice of Allowance and Search Report dated Nov. 26, 2024 in TW Application No. 113100849, with English translation.
TW Office Action and Search Report dated Aug. 28, 2025 in TW Application No. 114106249, with English Translation.
TW Office Action dated Dec. 5, 2023 in TW Application No. 109102175, with English Translation.
U.S. Advisory Action dated Mar. 18, 2024 in U.S. Appl. No. 17/080,749.
U.S. Corrected Notice of Allowance dated Nov. 17, 2023 in U.S. Appl. No. 17/644,760.
U.S. Final Office Action dated Aug. 11, 2025 in U.S. Appl. No. 17/424,449.
U.S. Final Office Action dated Jun. 14, 2024 in U.S. Appl. No. 17/424,449.
U.S. Final Office Action dated Nov. 21, 2023 in U.S. Appl. No. 17/080,749.
U.S. Non-Final Office Action dated Jan. 30, 2025 in U.S. Appl. No. 17/424,449.
U.S. Non-Final Office Action dated May 24, 2023 in U.S. Appl. No. 17/080,749.
U.S. Non-Final Office Action dated Nov. 15, 2024 in U.S. Appl. No. 18/427,348.
U.S. Non-Final Office Action dated Nov. 24, 2023 in U.S. Appl. No. 17/424,449.

(56) References Cited

OTHER PUBLICATIONS

U.S. Notice of Allowance dated Apr. 5, 2023 in U.S. Appl. No. 17/644,760.
U.S. Notice of Allowance dated Apr. 8, 2025 in U.S. Appl. No. 18/427,348.
U.S. Notice of Allowance dated Apr. 25, 2023 in U.S. Appl. No. 17/644,761.
U.S. Notice of Allowance dated Aug. 24, 2023 in U.S. Appl. No. 17/644,760.
U.S. Notice of Allowance dated Jul. 14, 2023 in U.S. Appl. No. 17/644,761.
U.S. Notice of Allowance dated Mar. 5, 2024 in U.S. Appl. No. 17/633,942.
U.S. Notice of Allowance dated May 3, 2023 in U.S. Appl. No. 17/644,761.
U.S. Notice of Allowance dated Oct. 30, 2023, in U.S. Appl. No. 17/633,942.
U.S. Notice of Allowance dated Sep. 12, 2023 in U.S. Appl. No. 17/644,760.
CN Office Action dated Apr. 25, 2017 in CN Application No. 201510266980.4.
CN Office Action dated Dec. 20, 2021, in CN Application No. 201880055786.3 with English translation.
CN Office Action dated Jan. 4, 2018 in CN Application No. 201510266980.4.
EP Extended Search Report dated Jun. 18, 2021 in EP Application No. 18852315.3.
International Preliminary Report on Patentability dated Mar. 3, 2022, in PCT Application No. PCT/US2020/045281.
International Search Report and Written Opinion dated Nov. 13, 2020 in PCT Application No. PCT/US2020/045281.
International Preliminary Report on Patentability dated Jan. 5, 2023 in PCT Application No. PCT/US2021/038215.
International Preliminary Report on Patentability dated Jul. 23, 2020 in PCT Application PCT/US2018/048029.
International Search Report and Written Opinion dated Dec. 11, 2018 (ISA/KR) in PCT Application PCT/US2018/048029.
International Search Report and Written Opinion dated Oct. 22, 2021, in PCT Application No. PCT/US2021/038215.
JP Office Action dated Oct. 4, 2022 in Application No. JP20200511239 with English translation.
KR Office Action dated Jun. 17, 2022, in Application No. KR10-2020-7009256 With English Translation.
KR Office Action dated Jun. 26, 2022 in Application No. KR10-2021-7041758 With English Translation.
KR Office Action dated Jun. 26, 2022 in Application No. KR10-2021-7041761 With English Translation.
KR Office Action dated Oct. 26, 2022 in Application No. KR10-2020-7009256 with English translation.
KR Office Action dated Oct. 26, 2022 in Application No. KR10-2021-7041758 with English translation.
KR Office Action dated Oct. 27, 2022 in Application No. KR10-2021-7041761 With English Translation.
KR Office Action and search report dated Jul. 27, 2022 in Application No. KR10-2022-0088448.
KR Office Action dated Aug. 22, 2022 in Application No. KR10-2022-0088448 with English translation.
KR Office Action dated Dec. 23, 2022 in Application No. KR10-2022-0088448 with English translation.
KR Office Action dated Feb. 18, 2022, in KR Application No. 1020207009256 with English Translation.
KR Office Action dated Feb. 21, 2022, in KR Application No. 10-2021-7041758 with English Translation.
KR Office Action dated Feb. 21, 2022, in KR Application No. 10-2021-7041761 with English translation.
KR Office Action dated Jul. 4, 2022 in Application No. KR10-2022-7008634 With English Translation.
KR Office Action dated Jun. 21, 2021 in KR Application No. 10-2022-0035739.
KR Office Action dated Jun. 28, 2022, in Application No. KR10-2022-0035739 with English translation.
KR Office Action dated Nov. 25, 2022 in Application No. KR10-2022-7008634 With English Translation.
KR Office Action dated Oct. 25, 2022, in Application No. KR10-2022-0035739 with English translation.
TW Search Report & Grant Decision dated Nov. 30, 2018 in TW Application No. 104115987.
TW Search Report & Grant Decision dated Dec. 28, 2021, in TW Application No. 107130221 with English translation.
U.S. Advisory Action dated Sep. 23, 2022 in U.S. Appl. No. 17/644,760.
U.S. Corrected Notice of Allowance dated Aug. 10, 2022 in U.S. Appl. No. 17/644,759.
U.S. Final office Action dated Aug. 22, 2022 in U.S. Appl. No. 17/644,760.
U.S. Advisory Action dated Sep. 28, 2022, in U.S. Appl. No. 17/644,761.
U.S. Appl. No. 15/846,100, inventors Kim et al., filed on Dec. 18, 2017.
U.S. Corrected Notice of Allowance dated Oct. 26, 2022 in U.S. Appl. No. 17/644,761.
U.S. Final office Action dated Jul. 5, 2022 in U.S. Appl. No. 17/644,761.
U.S. Final Office Action dated Jan. 15, 2020 in U.S. Appl. No. 15/692,300.
U.S. Final Office Action dated Jun. 27, 2017 in U.S. Appl. No. 14/285,544.
U.S. Final Office Action dated Sep. 21, 2016 in U.S. Appl. No. 14/285,544.
U.S. Non-Final Office Action dated Apr. 22, 2016 in U.S. Appl. No. 14/285,544.
U.S. Non-Final Office Action dated Dec. 23, 2016 in U.S. Appl. No. 14/285,544.
U.S. Non-Final Office Action dated May 5, 2022 in U.S. Appl. No. 17/644,760.
U.S. Non-Final Office Action dated Oct. 27, 2015 in U.S. Appl. No. 14/285,544.
U.S. Notice of Allowance (corrected) dated Sep. 18, 2020 in U.S. Appl. No. 15/692,300.
U.S. Notice of Allowance dated Aug. 4, 2020 in U.S. Appl. No. 15/692,300.
U.S. Notice of Allowance dated May 3, 2022 in U.S. Appl. No. 17/644,759.
U.S. Notice of Allowance dated Oct. 17, 2022 in U.S. Appl. No. 17/644,760.
U.S. Notice of Allowance dated Oct. 18, 2022 in U.S. Appl. No. 17/644,761.
U.S. Notice of Allowance dated Sep. 21, 2017 in U.S. Appl. No. 14/285,544.
U.S. Office Action dated Apr. 14, 2022 in U.S. Appl. No. 17/644,760.
U.S. Office Action dated Mar. 10, 2022 in U.S. Appl. No. 17/644,761.
U.S. Office Action dated Mar. 26, 2020 in U.S. Appl. No. 15/692,300.
U.S. Office Action dated Sep. 12, 2019 in U.S. Appl. No. 15/692,300.
U.S. Restriction requirement dated May 11, 2015 in U.S. Appl. No. 14/285,544.
International Preliminary Report on Patentability and Written Opinion dated Mar. 5, 2026 in PCT Application No. PCT/US2024/042531.
JP Office Action dated Feb. 24, 2026 in JP Application No. 2025-007417, with English Translation.
KR Notice of Allowance dated Jan. 25, 2026 in KR Application No. 10-2023-7003165, with English Translation.
TW Notice of Allowance and Search Report dated Oct. 27, 2025 in TW Application No. 114112762, with English translation.
U.S. Appl. No. 19/513,068, inventors Huang Y et al., filed on Feb. 20, 2026.

* cited by examiner

MULTI-STATION PROCESSING TOOLS WITH STATION-VARYING SUPPORT FEATURES FOR BACKSIDE PROCESSING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

The present disclosure relates to multi-station processing tools for backside processing.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one aspect, a multi-station plasma processing system is provided, wherein the system includes: a first processing station comprising a first set of support features configured to support a substrate at a first set of positions on a backside of the substrate when the substrate is processed at the first processing station; and a second processing station comprising a second set of support features configured to hold the substrate at a second set of positions on the backside of the substrate when the substrate is processed at the second processing station, wherein the first set of positions are non-overlapping with the second set of positions.

In another aspect, a multi-station plasma processing system for processing a substrate having a nominal diameter of D is provided, wherein the system includes: a first processing station having a first set of support features; a second processing station having a second set of support features; and an indexer configured to rotate about a center axis and to thereby transfer the substrate from the first processing station to the second processing station, wherein the first set of support features has a first set of contact surfaces positioned within a first circular region having a first diameter of D and centered on a first center point of the first processing station, wherein the second set of support features has a second set of contact surfaces positioned within a second circular region having a second diameter of D and centered on a second center point of the second processing station, and wherein a rotational transform of the first center point and the first set of contact surfaces about the center axis such that the rotationally transformed first center point aligns with the second center point results in no overlap between the second set of contact surfaces and the rotationally transformed first set of contact surfaces when viewed along the center axis.

In another aspect, a method for processing a backside of a substrate in a multi-station plasma processing system is provided, wherein the system includes a first station with a first set of support features and the system includes a second station with a second set of support features and wherein the method includes: moving a substrate onto the first set of support features; processing the backside of the substrate while the substrate is on the first set of support features, wherein the first set of support features block processing of the backside of the substrate at a first set of locations on the backside of the substrate; moving the substrate onto the second set of support features; and processing the backside of the substrate while the substrate is on the second set of support features, wherein the second set of support features do not block processing of the backside of the substrate at the first set of locations on the backside of the substrate.

DETAILED DESCRIPTION

Figure 1:
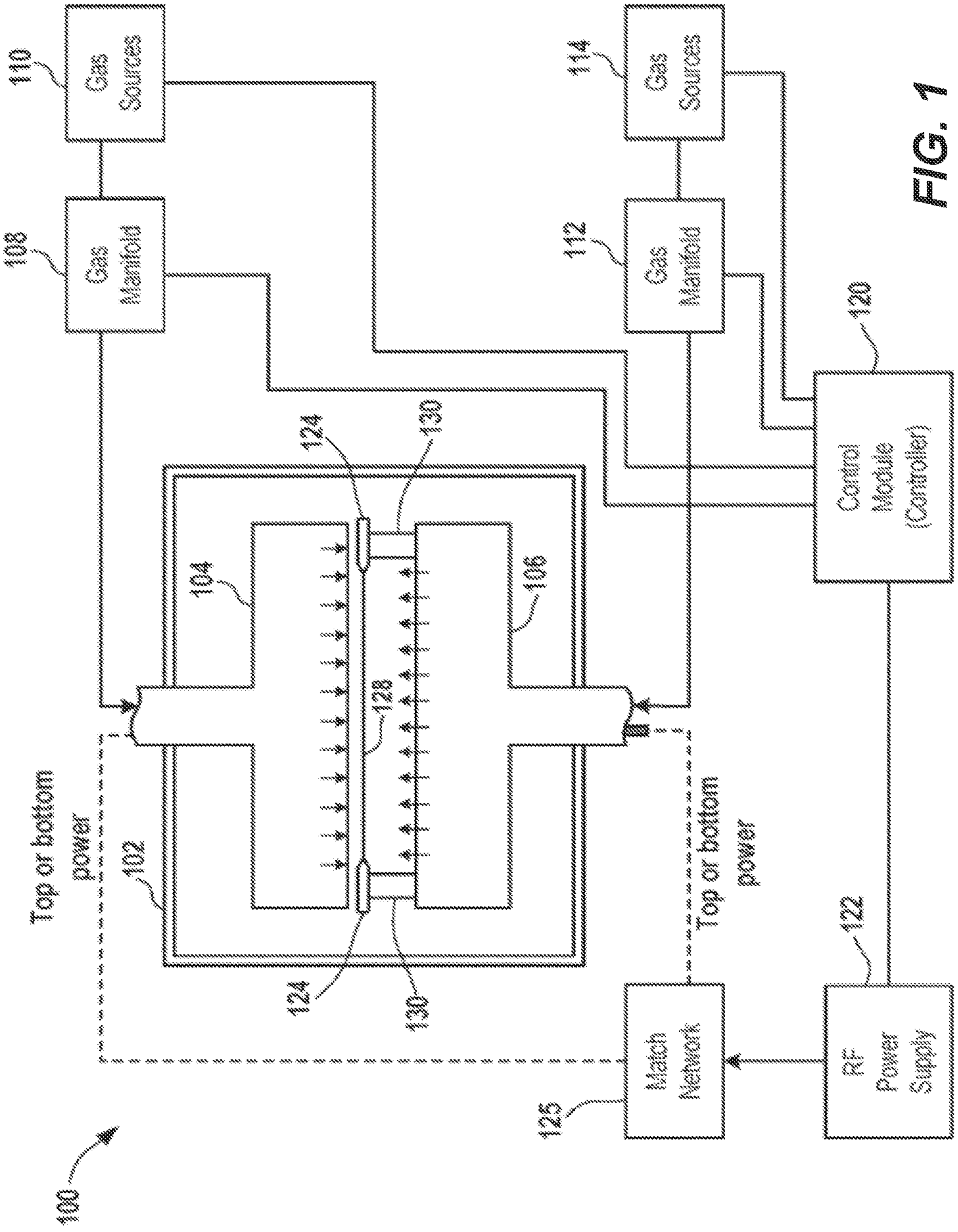
FIG. 1 is a schematic diagram of a substrate processing system in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Portions of the present disclosure relate to plasma-enhanced chemical vapor deposition (PECVD). PECVD is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor. Typically, chambers used for PECVD use ceramic pedestals for supporting the wafer during processing, which enables processing under high temperatures.

Most PECVD deposition and other processing to form the devices occur on the front face of a wafer, e.g., top-side. As the deposited layers build up, they can introduce stress in the wafer. This stress can cause the wafer to bow, which is undesirable. Where bowing is significant, it can deleteriously affect subsequent processing steps. Sometimes, depositing materials on the back-side of the wafer may counteract wafer bowing and stress. However, to deposit on a back-side of the wafer, the wafer has to be flipped and loaded as back-side up. Flipping the wafer introduces additional problems, such as additional handling, potential exposure to particles, and/or reduction in processing yield.

Embodiments of the disclosure provide implementations of a multi-station processing tools with station-varying support features (sometimes also referred to as lifting features) for backside processing such deposition and etching. During backside deposition, etching, and/or other processing within a single station, a lifting feature may block deposition, etching, and/or other processing on a wafer or other substrate being processed at the point of contact of the lifting feature. In some current designs, a carrier ring has support features that hold the wafer during deposition. As the carrier ring moves from station-to-station within a multi-station reactor, the support features do not more move with respect to the wafer. The carrier ring carries the wafer from station-to-station. In such designs, it is not possible to deposit, etch, and/or perform other processing on all locations of the wafer.

In one implementation, a first station may have a first set of support features that contact wafers or other substrates being processed at a first set of positions, while a second station may have a second set of support features that contact the wafers or other substrates being processed at a second set of positions different from the first set of positions. As a result, areas that are blocked by the first set of support features during deposition, etching, and/or other processing in the first station may be exposed during deposition, etching, and/or other processing in the second station. This allows for control of the deposition profile, etching profile, and/or other processing profile in an azimuthal direction and enables deposition, etching, and/or other processing of a film on all portions of the backside without any full thickness voids or other azimuthal non-uniformities. As an example and during etching, this enables etching of all portions of the backside without portions being completely un-etched. In some implementations, the support features are not part of the carrier ring. Rather, the support features are part of a station, with each station of a multi-station reactor having its own support features.

Multi-level semiconductor processing flows used to manufacture advanced memory and logic chips have caused substrates to warp significantly in compressive and tensile directions. Due to this moderate to severe substrate warpages, processing conditions of various manufacturing processes are compromised causing process control issues, lithography chucking and overlay issues, which sometimes cause increases in yield loss. In one embodiment, one way to control the warpage is to deposit a sacrificial film or multiple films on the opposite side (i.e., back-side) of the substrate to compensate the warpage in opposite direction resulting in flattening of the substrate. The traditional dual electrode radio-frequency (RF) plasma-enhanced chemical vapor deposition (PECVD) systems have one gas-flowing electrode that can be RF or ground. Typically, the gas flowing electrode (also referred to as a showerhead 104) is on the top side of the PECVD reactor causing the reactants to flow on the front-side of the wafer causing deposition only on the front-side of the wafer.

In accordance with one embodiment, an RF PECVD system is disclosed that has dual gas-flowing electrodes. Either one of the electrodes can be an RF electrode to provide AC fields enabling plasma enhancements for CVD film depositions. This dual gas-flowing electrode PECVD system is capable of selectively depositing films on both or only one side of the wafer. In one example, a gas-flowing pedestal (referred to herein as a “shower-pedestal” or “show-ped”) can hold the wafer for transfers within the chamber between adjacent stations or outside the chamber via standard transfer mechanisms based on the equipment setup, yet be able to flow gases from the back-side of the wafer. In some other embodiments, a system configured for backside deposition, etching, or other operations may not include a shower-pedestal and may utilize other structures for flow gases to the back-side of the wafer.

In one embodiment, the back-side gas flow enables the PECVD deposition on the back-side of the wafer while the front-side gas flow can deposit on the front side of the wafer. The system can be setup to selectively enable the side of the deposition by turning on and off the reactants that cause the film deposition and replacing them with non-reacting gases (e.g., inert gases). Another aspect of this system is to be able to control the distance of side of the substrate from the reactant flowing gases. This control enables achieving the deposition profile and film properties that are needed for the applications such as back-side compensation.

In another embodiment, the show-ped and showerhead include configurations that provide showerhead-like features that enable proper reactant mixing and providing appropriate flow dynamics for PECVD deposition processes on the back-side of the wafer, or front side. Additionally, some embodiments enable for a controllable gap that can suppress or allow the plasma on the desired (one or both) sides of the wafer for deposition. The gaps being controlled can include, e.g., a gap spacing between a top side of the wafer and the top surface of the showerhead 104 (as shown in FIG. 1), and a gap spacing between a back side of the wafer and the top surface of the show-ped 106 (as shown in FIG. 1). For example, while the back side of the wafer is being deposited, the gap between the top side of the wafer and the top surface of the showerhead is minimized.

The show-ped 106 is further configured to include a showerhead hole pattern and inner plenums for even distribution of gases. A showerhead hole pattern and inner plenums that provide even distribution of gases allows for process gases to be delivered toward the bottom of the wafer with a suitably even distribution. The embodiments also allow for the gas-flowing pedestal (i.e., show-ped) to have an active heater to get the process gas to the proper temperature. The combination of the show-ped 106 and showerhead 104 allows for the concurrent function of both of key attributes. The show-ped 106 can, in one embodiment, still heat the wafer and provide the wafer transfer features within the reactor chamber or outside the reactor, while the showerhead 104 components allows for process gas flow. The gas-flowing pedestal (i.e., show-ped) disclosed herein therefore enable implementation of traditional PECVD processes to deposit on either side of the wafer, selectively. These configurations are also configured to selectively RF power the top or bottom electrode, and dynamically enable/disable the plasma on the side of the wafer that needs deposition.

Broadly speaking, the show-ped provides several advantages for combating the stress and bowing issues by depositing a film on the back side of the wafer. The back side film counteracts the stress from the front side deposition to result in a neutral stress (or substantially neutral stress, e.g., less than about +/−150 MPa) wafer that shows no bowing (or substantially no bowing, e.g., less than about 150 μm of bow). If the film deposited on the front side is tensile, then the back side film should also be tensile to balance out the overall stress. Likewise, if the front side film is compressive, then the back side film should also be compressive. The back side film may be deposited through various reaction mechanisms (e.g., chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), etc.). In various cases, plasma enhanced chemical vapor deposition is used due to the high deposition rate achieved in this type of reaction.

Certain deposition parameters can be tuned to produce a back side film having a desired stress level. One of these deposition parameters is the thickness of the deposited back side film. Thicker films induce more stress in the wafer, while thinner films (of the same composition and deposited under the same conditions) induce less stress in the wafer. Therefore, in order to minimize the amount of material consumed in forming the back side layer, this layer may be deposited relatively thinly under conditions that promote formation of a highly stressed film.

In some embodiments, a multi-station processing tool may have station-varying support features for backside deposition. During backside deposition within a single station, a support feature may block deposition on a wafer or other substrate being processed at the point of contact of the support feature. In one implementation, a first station may have a first set of support features that contact wafers or other substrates being processed at a first set of positions, while a second station may have a second set of support features that contact the wafers or other substrates being processed at a second set of positions different from the first set of positions. As a result, areas that are blocked by the first set of support features during deposition in the first station may be exposed during deposition in the second station. Thus, a backside layer may be deposited on all portions of the backside without any full thickness voids. While much of the present disclosure references to benefits of station-varying support features (also referred to as support features) for backside deposition, the station-varying support features may also be utilized and provide benefits for other kinds of backside processing such as etching.

As mentioned, stacks of deposited materials are especially likely to result in wafer stress and bowing. One example stack that may cause these problems is a stack having alternating layers of oxide and nitride (e.g., silicon oxide/silicon nitride/silicon oxide/silicon nitride, etc.). Another example stack likely to result in bowing includes alternating layers of oxide and polysilicon (e.g., silicon oxide/polysilicon/silicon oxide/polysilicon, etc.). Other examples of stack materials that may be problematic include, but are not limited to, tungsten and titanium nitride. The materials in the stacks may be deposited through chemical vapor deposition techniques such as plasma enhanced chemical vapor deposition (PECVD), low pressure chemical vapor deposition (LPCVD), metal organic chemical vapor deposition (MOCVD), atomic layer deposition (ALD), plasma enhanced atomic layer deposition (PEALD), or through direct metal deposition (DMD), etc. These examples are not intended to be limiting. Certain disclosed embodiments may be useful whenever wafer stress and/or bowing are induced due to material present on the front side of the wafer.

The front side stacks may be deposited to any number of layers and thicknesses. In a typical example, the stack includes between about 32-72 layers, and has a total thickness between about 2-4 μm. The stress induced in the wafer by the stack may be between about −500 MPa to about +500 MPa, resulting in a bow that is frequently between about 200-400 μm (for a 300 mm wafer), and even greater in some cases.

The material deposited on the back side of the wafer may be a dielectric material in various embodiments. In some cases, an oxide and/or nitride (e.g., silicon oxide/silicon nitride) is used. Examples of silicon-containing reactants that may be used include, but are not limited to, silanes, halosilanes, and aminosilanes. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chlorocthylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino) silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$). Other potential silicon-containing reactants include tetraethyl orthosilicate (TEOS), and cyclic and non-cyclic TEOS variants such as tetramethoxysilane (TMOS), fluorotriethoxysilane (FTES), Trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane ($VSI_2$), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(trichtoxysilyl) ethane (BTEOSE), bis(trimethoxysilyl) ethane (BTMOSE), dimethylethoxysilane (DMEOS), tetraethoxydimethyldisiloxane (TEODMDSO), tetrakis(trimehtylsiloxy) silane (TTMSOS), tetramethyldiethoxydisiloxane (TMDEODSO), triethoxysilane (TIEOS), trimethoxysilane (TIMEOS), or tetrapropoxysilane (TPOS).

Example nitrogen-containing reactants include, but are not limited to, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Examples of oxygen-containing co-reactants include oxygen, ozone, nitrous oxide, carbon monoxide, nitric oxide, nitrogen dioxide, sulfur oxide, sulfur dioxide, oxygen-containing hydrocarbons (CxHyOz), water, mixtures thereof, etc.

The flow rate of these reactants will depend greatly on the type of reaction through which the back side layer is deposited. Where CVD/PECVD are used to deposit the back side layer, the flow rate of the silicon-containing reactant may be between about 0.5-10 mL/min (before atomization), for example between about 0.5-5 ml/min. The flow rate of a nitrogen-containing reactant, oxygen-containing reactant, or other co-reactant may be between about 3-25 standard liters per minute (SLM), for example between about 3-10 SLM.

In certain implementations the back side layer may be removed after further processing. Where this is the case, the composition of the back side layer should be chosen such that it can be easily removed from the substrate at an appropriate time. In this regard, there should be a high selectivity between the material of the back side layer (e.g., the dielectric) and the material of the underlying substrate (e.g., silicon) in the desired removal chemistry.

The optimal thickness of the back side layer will depend on the amount of stress induced by the deposition on the front side of the wafer, as well as the conditions under which the back side layer is deposited. The back side layer may be deposited to a thickness at which the stress in the wafer becomes negligible (e.g., less than about 150 MPa). In these or other embodiments, the back side layer may be deposited to a thickness at which the wafer bow becomes negligible (e.g., less than about 150 μm of bow). In some cases, this corresponds to a back side layer thickness between about 0.1-2 μm, for example between about 0.3-2 μm, or between about 0.1-1 μm, or between about 0.3-1 μm. Where silicon nitride is used to form the back side layer, a film having a thickness of about 0.3 μm is sufficient to mitigate a bow of about 50-200 μm. As mentioned above, a higher stress back side layer may be used to reduce the required thickness of the layer. This helps conserve materials and reduce costs.

It should be appreciated that the present embodiments can be implemented in numerous ways, such as a process, an apparatus, a system, a device, or a method. Several embodiments are described below.

Deposition of films is in one embodiment implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

FIG. 1 illustrates a substrate processing system 100, which is used to process a wafer 128. The system includes a chamber 102. A center column is configured to support a pedestal for when a top surface of the substrate 128 is being processed, e.g., a film is being formed on the top surface. The pedestal, in accordance with embodiments disclosed herein, is referred to as a showerhead-pedestal ("show-ped") 106. A showerhead 104 is disposed over the show-ped 106. In one embodiment, the showerhead 104 is electrically coupled to power supply 122 via a match network 125. The power supply 122 is controlled by a control module 120, e.g., a controller. In other embodiments, it is possible to provide power to the show-ped 106 instead of the showerhead 104. The control module 120 is configured to operate the substrate processing system 100 by executing process input and control for specific recipes. Depending on whether the top surface of the substrate 128 is receiving a deposited film or the bottom surface of the substrate 128 is receiving a deposited film, the controller module 120 sets various operational inputs, for a process recipe, e.g., such as power levels, timing parameters, process gasses, mechanical movement of the wafer 128, height of the wafer 128 off of the show-ped 106, etc. In implementations having multiple processing chambers 102 (such as the examples of FIGS. 2 and 3), the system 100 may include power supplies 122 and associated elements such as match networks 125, each of which is coupled to a shower-ped 106 and/or a showerhead 104 in a respective one of the chambers 102. In other embodiments, a single power supply 122 may be coupled to shower-peds 106 and/or showerheads 104 in multiple chambers 102. One or more of the control module 120, gas sources 114, gas manifold 112, gas manifold 108, gas sources 110, match network 125, RF power supply 112, show-ped 106, showerhead 104, and processing chamber may form equipment for depositing a film on a backside of a substrate. As discussed in further detail below, a multi-station processing tool may include multiple two or more processing stations including the aforementioned equipment for depositing a film on a backside of a substrate. Some of the aforementioned equipment may be shared by multiple processing stations in the multi-station processing tool. Additionally, a single wafer may be processed by multiple stations in a multi-station processing tool. Therefore, a first processing station in the multi-station processing tool may have first equipment for depositing a firm film on a backside of a substrate and a second processing station in the multi-station processing tool may have second equipment for depositing a second film on the backside of the substrate.

The center column can also include lift pins, which are controlled by a lift pin control. The lift pins are used to raise the wafer 128 from the show-ped 106 to allow an end-effector to pick the wafer and to lower the wafer 128 after being placed by the end end-effector. The end effector (not shown), can also place the wafer 128 over spacers 130. As will be described below, the spacers 130 are sized to provide a controlled separation of the wafer 128 between a top surface of the showerhead 104 (facing the wafer) and a top surface of the show-ped 106 (facing the wafer).

The substrate processing system 100 further includes a gas manifold 108 that is connected to gas sources 110, e.g., gas chemistry supplies from a facility and/or inert gases. Depending on the processing being performed over a top surface of the substrate, the control module 120 controls the delivery of gas sources 110 via the gas manifold 108. The chosen gases are then flown into the showerhead 104 and distributed in a space volume defined between a face of the showerhead 104 that faces that wafer 128 when the wafer is resting over the pedestal 140.

The substrate processing system 100 further includes a gas manifold 112 that is connected to gas sources 114, e.g., gas chemistry supplies from a facility and/or inert gases. Depending on the processing being performed over a bottom surface of the substrate, the control module 120 controls the delivery of gas sources 114 via the gas manifold 112. The chosen gases are then flown into the showerhead 104 and distributed in a space volume defined between a face of the show-ped 106 that faces an under surface/side of the wafer 128 when the wafer is resting over on the spacers 130. The spacers 130 provide for a separation that optimizes deposition to the under surface of the wafer 128, while reducing deposition over the top surface of the wafer. In one embodiment, while deposition is targeted for the under surface of the wafer 128, an inert gas is flown over the top surface of the wafer 128 via the showerhead 104, which pushes reactant gas away from the top surface and enables reactant gases provided from the show-ped 106 to be directed to the under surface of the wafer 128. In implementations having multiple processing chambers 102 (such as the examples of FIGS. 2 and 3), the system 100 may include multiple gas manifolds 112, each of which is coupled to a show-ped 106 in a respective one of the chambers 102; and/or may include multiple gas manifolds 108, each of which is coupled to a showerhead 104 in a respective one of the chambers 102.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 124 that encircles an outer region of the show-ped 106. When the top surface of the wafer 128 is being processed, e.g., a material is being deposited thereon, the carrier ring 124 is configured to sit over a carrier ring support region that is a step down from a wafer support region in the center of the pedestal show-ped 106. The carrier ring 124 includes an outer edge side of its disk structure, e.g., outer radius, and a wafer edge side of its disk structure, e.g., inner radius, that is closest to where the wafer 128 sits. The wafer edge side of the carrier ring 124 includes a plurality of contact support structures which are configured to support the wafer 128. The spacers 130 may include carrier ring support features that support the carrier ring 124. The spacers 130 may include wafer support features that support the wafer 128 off of the carrier ring 124 when the carrier ring 124 is held by the spacers 130.

In some implementations, the chamber 102 may be a processing chamber in a multi-station processing tool and the wafer support features of the spacers 130 may engage with wafers at different azimuthal locations on the wafers depending on which station the wafers are in. As an example, the spacers 130 in a first processing station may include wafer support features that support the wafer 128 by engaging with the wafer at a first set of positions (e.g., three or more positions arranged evenly or unevenly around the circumference of the wafer), while the spacers 130 in a second processing station may include wafer support features that support the wafer 128 by engaging with the wafer at a second set of positions (e.g., three or more positions arranged evenly or unevenly around the circumference of the wafer). The first and second sets of positions may be non-overlapping or may only partially overlap. With arrangements of this type, backside deposition within the first station may result in voids in the backside film applied to wafer 128 at the first set of positions, due to physical occlusion at the first set of positions by the wafer support features of spacers 130. However, backside deposition within the second station can at least partially fill those voids, since the wafer support features in the second station engage with the wafer 128 at the second set of positions, which don't overlap, or only partially overlap, with the first set of positions.

In some other implementations, the wafer 128 may be rotated when moving from one station to the next, such that the wafer 128 engages the spacers 130 or other wafer support features at different azimuthal positions on the wafer when resting in each of the stations. Rotation of the wafer between stations may be sufficient to ensure that a backside film is deposited in a desired manner (e.g., that the backside film is free of full thickness voids). In such implementations, the spacers 130 or other wafer support features may be at the same azimuthal locations across multiple stations.

Figure 3:
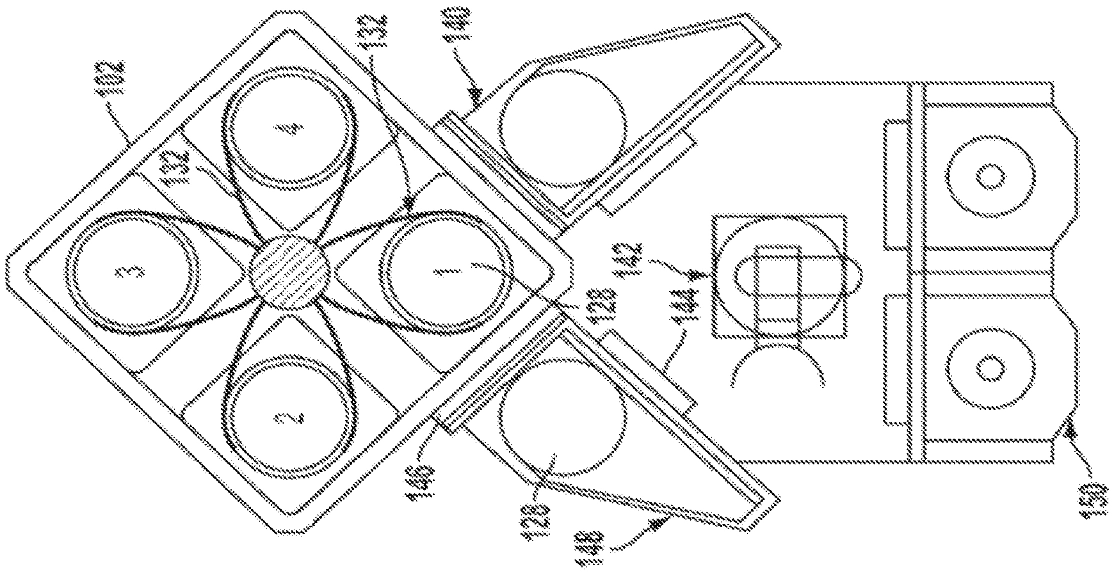
FIG. 3 is a schematic view of a multi-station processing tool in accordance with certain disclosed embodiments.
Figure 2:
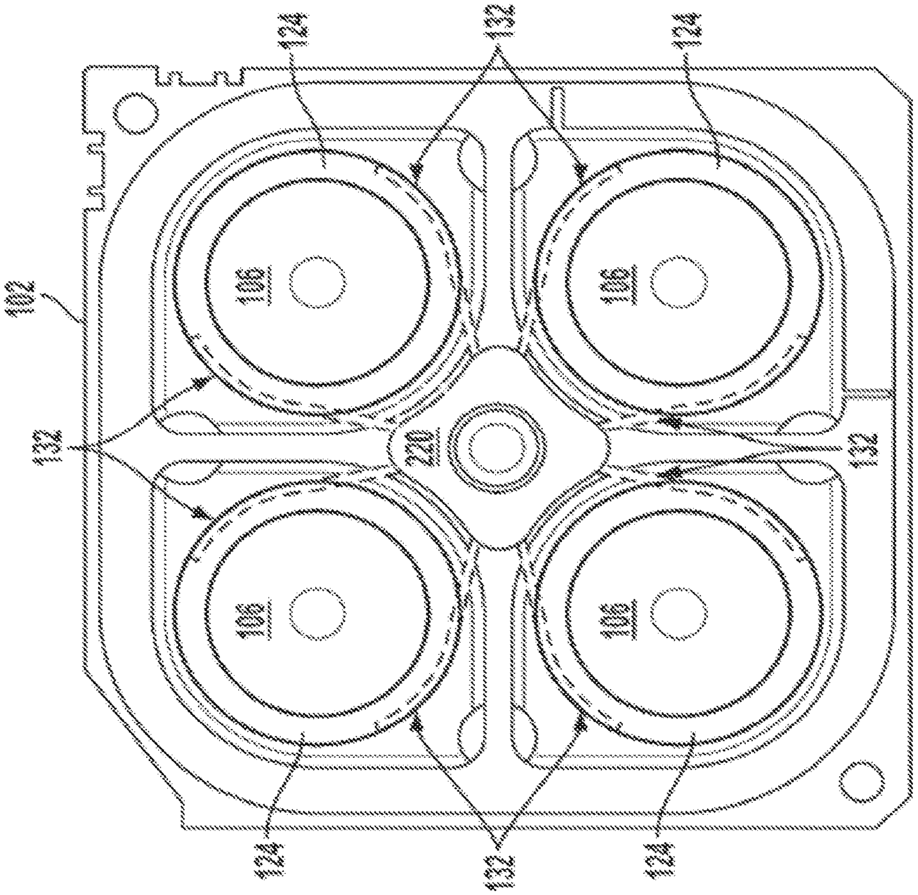
FIG. 2 is a top view of a multi-station processing tool in accordance with certain disclosed embodiments.

FIG. 2 illustrates a top view of a multi-station processing tool, wherein four processing stations are provided. The embodiment of FIG. 1 illustrates a chamber 102, which can be implemented in chamber 102 of FIGS. 2 and 3, which have four chamber stations. FIGS. 2 and 3 provide top views of a chamber portion (e.g., with a top chamber portion removed for illustration), wherein four stations are accessed by spider forks 132. Each spider fork 132, or fork includes a first and second arm, each of which is positioned around a portion of each side of the show-ped 106. In this view, the spider forks 132 are drawn in dash-lines, to convey that they are below the carrier ring 124. The spider forks 132, using an engagement and rotation mechanism 220 are configured to raise up and support the carrier rings 124 (i.e., from a lower surface of the carrier rings 124) from the stations simultaneously, and then rotate at least one or more stations before lowering the carrier rings 124 (where at least one of the carrier rings supports a wafer 128) to a next location so that further plasma processing, treatment and/or film deposition can take place on respective wafers 128. As noted above, in one embodiment, the spider forks 132 can be used to lower the wafer 128 onto (and raise the wafer 128 off of) wafer support features such as spacers 130. Spacers 130 may hold the wafer 128 at a height that enables deposition on a backside of the wafer 128, while substantially preventing deposition on a topside of the wafer 128, e.g., as shown in FIG. 1.

FIG. 3 shows a schematic view of an embodiment of a multi-station processing tool with an inbound load lock 148 and an outbound load lock 140. A robot 142, at atmospheric pressure, is configured to move substrates 128 from a cassette loaded through a pod 150 into inbound load lock 148 via an atmospheric port 144. Inbound load lock 148 is coupled to a vacuum source (not shown) so that, when atmospheric port 144 is closed, inbound load lock 148 may be pumped down. Inbound load lock 148 also includes a chamber transport port 146 interfaced with processing chamber 102. Thus, when chamber transport 146 is opened, another robot (not shown) may move the substrate from inbound load lock 148 to a show-ped 106 of a first process station for processing.

The depicted processing chamber 102 comprises four process stations, numbered from 1 to 4 in the embodiment shown in FIG. 3. In some embodiments, processing chamber 102 may be configured to maintain a low pressure environment so that substrates may be transferred using a carrier ring 124 among the process stations without experiencing a vacuum break and/or air exposure. Each process station depicted in FIG. 3 a show-ped 106 that is configured to deliver a process gas when backside deposition is to occur. During backside deposition, when spacers having wafer support features are used to hold the wafer off of the show-ped 106, the showerhead 104 may be configured to supply an inert gas over the top surface of the substrate to prevent or reduce deposition over the top surface of the wafer 106.

FIG. 3 also depicts spider forks 132 for transferring wafers within processing chamber 102. As will be described in more detail below, the spider forks 132 can also rotate and enable transfer of wafers from one station to another. The transfer occurs by enabling the spider forks 132 to lift carrier rings 124 from an outer undersurface, which then lifts the wafer, and then rotates the wafer and carrier 124 together to the next station. In one configuration, the spider forks 132 are made from a ceramic material to withstand high levels of heat during processing.

In other embodiments, instead of using spider forks 132 to lift and transfer the wafers, a paddle type structure can also function to lift and transfer the wafers. Paddles can be disposed between the stations, similar to the way the spider forks 132 sit, and can function in the same way. Thus, for easy of understanding, references to spider forks 132 should be understood to also apply to paddle configurations, which can provide the control lifting (e.g., during backside wafer deposition) and transfers between stations. In some cases, structures configured to lift, support, and/or transfer wafers (such as spider forks 132) may be referred to as "indexers" or "rotational indexers." These structures may be part of a rotational carousel for moving wafers between stations. Thus, for easy of understanding, references to spider forks 132 should be understood to also refer to "indexers" or "rotational indexers", even when such structures differ from "spider forks" (e.g., have different structural arrangements, utilize different techniques for supporting and/or moving wafers, etc.).

Broadly speaking, the embodiments disclosed herein are for a system to deposit PECVD films on the selective side of the wafer (front and/or back) with dynamic control. One embodiment includes a dual gas-flowing electrode for defining a capacitively-coupled PECVD system. The system will include a gas-flowing showerhead 104 and a show-ped 106. In one embodiment, the gas-flowing pedestal (i.e., show-ped) is a combination showerhead and pedestal, which enables deposition on a back-side of the wafer. The electrode geometry combines features of a showerhead, e.g., such as a gas mixing plenum, holes, hole-pattern, gas jet preventing baffle, and features of a pedestal, e.g., such as embedded controlled heater, wafer-lift mechanisms (also referred to as wafer support features and wafer support structures), ability to hold plasma suppression rings, and movability. This enables the transfer of wafers and the processing of gasses with or without RF power from the pedestal.

In one embodiment, the system has wafer support features that include station-varying support features. As an example, the system may have spacers such as the spacers 130 of FIG. 1 with station-varying support features. In one embodiment, the wafer support features of a first process station engage with the underside, also referred to as the backside, of a wafer at a first plurality of locations (e.g., three or more) along the periphery of the wafer. As a result, the wafer support features of the first process station may physically occlude the underside of the wafer, thus preventing backside deposition, at the first plurality of locations. If the backside deposition in this first station was the only backside deposition performed, the wafer would have full-thickness voids in the backside film at the first plurality of locations (e.g., at the locations where the wafer support features engage with and hold up the wafer). Thus, in at least some embodiments, the wafer support features of a second process station are configured to engage with the underside of the wafer at a second plurality of locations along the periphery of the wafer. The second plurality of locations may not overlap, or only partially overlap, with the first plurality of locations. Thus, when a backside deposition is performed in the second process station, the portions having full-thickness voids (e.g., the regions occluded by the wafer support features of the first process station) may be at least partially filled in with a deposited backside layer. As a result, the multi-station processing system may be able to deposit a backside film that is free of full-thickness voids.

If desired, the multi-station processing system may have any number of processing stations (e.g., two, three, four, five, or more). In such embodiments, each processing station may have wafer support features that engage with the wafer at a set of locations on the underside of wafers that are unique to that particular processing station. Alternatively, two or more processing stations may have wafer support features that engage with the wafer at a common set of locations, while one or more other processing stations have wafer support features that engage with the wafer at a different set of locations. In general, increasing the number of processing stations having different engagement locations may help to reduce variations in backside depositions.

In one embodiment, the system has a wafer lift mechanism that allows tight control of parallelism of the substrates against the electrodes. In one embodiment, this is achieved by setting up the lift mechanism parallel to the two electrodes and controlling manufacturing tolerances, e.g., spindle or lift pins mechanisms. Another embodiment is defined by raising the wafer lift parts, but this option does not allow dynamic control of the side that gets deposited.

In one configuration, the lift mechanism allows controlling of the distance dynamically during the process (before plasma, during plasma, after plasma) to control the side of the deposition, profile of the deposition, and deposition film properties. The system further allows selective enabling/disabling of the side where reactants are flown. One side can flow the reactant and the other side can flow inert gases to suppress the deposition and plasma.

In one embodiment, the gap between the side of the wafer that does not need plasma or film deposition may be tightly controlled to suppress plasma (e.g., to reduce or eliminate plasma damage). In one example, this system allows minimal gap from about 2 mm to about 0.5 mm, and in another embodiment from about 1 mm to about 0.05 (limited by the wafer bow), and such gap can be controlled. In one embodiment, this gap depends upon the process conditions.

In one embodiment, the gas-flowing pedestal (i.e., show-ped) enables, without limitation: (a) thermal stabilization of the wafer to processing temperature prior to processing; (b) selective design of hole patterns on the show-ped to selectively deposition film in different areas of the back-side of the wafer; (c) swappable rings can be attached to achieve appropriate plasma confinement, hole pattern, and edge impedance (which may help achieve a desired radial-distribution of film properties); (d) stable wafer transfer mechanisms within chamber and for transferring wafer outside to another chamber or cassette-such as lift pins, RF-coupling features, minimum-contact arrays; (e) implement gas mixing features, e.g., such as inner plenum, baffle and manifold lines openings; and (f) add compartments in the gas-flowing pedestal (i.e., show-ped) to enable selective gas flow to different regions of the back side of the wafer and control flow rates via flow controllers and/or multiple plenums.

In another embodiment, dynamic gap control using wafer lift mechanism enables: (a) control of the distance from deposition or reactant flowing electrode to the side of the wafer that needs deposition or in the middle so that both sides can be deposited; and (b) the lift mechanism to control the distance dynamically during the process (before plasma, during plasma, after plasma) to control the side of the deposition, profile of the deposition, and deposition film properties. In another embodiment, for a deposition mode used to deposit on the back-side of the wafer, film edge exclusion control is highly desirable to avoid lithography-related overlay problems. The lift mechanism used in this system is done via a carrier ring 124 that has a design feature to shadow the deposition on the edge. This specifies the edge exclusion control via the design and shape of the carrier ring.

Figure 4A:
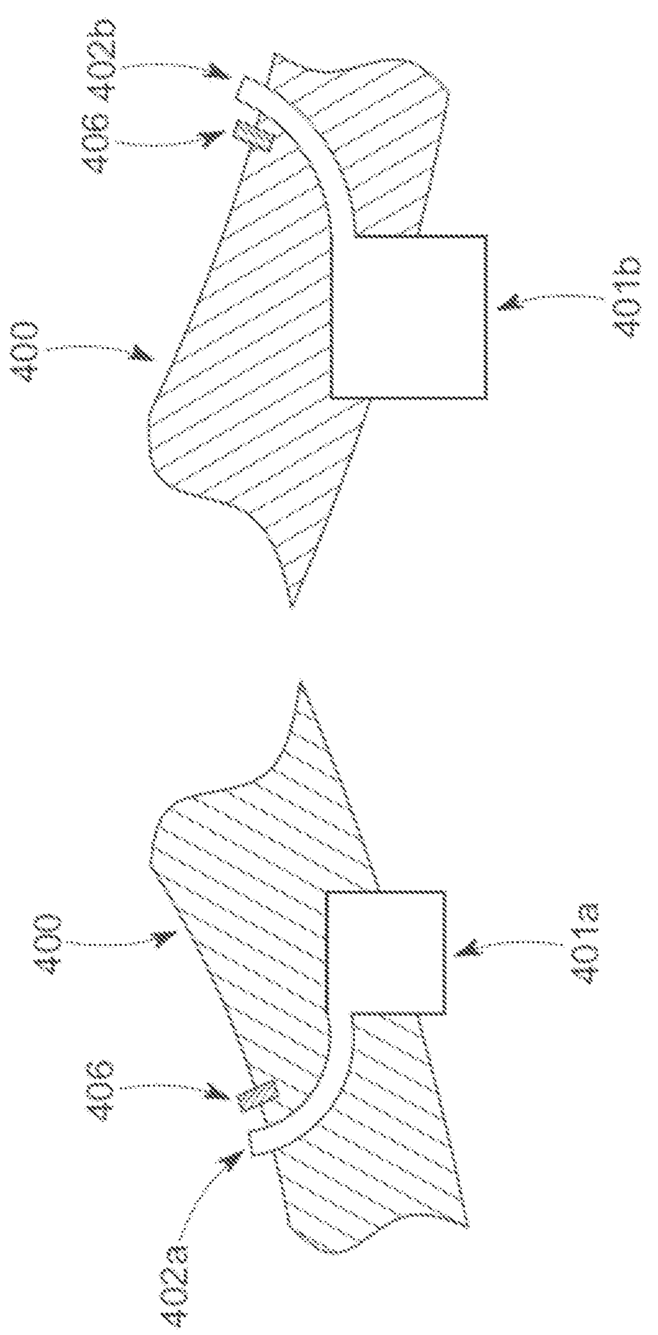
FIG. 4A is a perspective view of support features a multi-station processing tool.
Figure 4B:
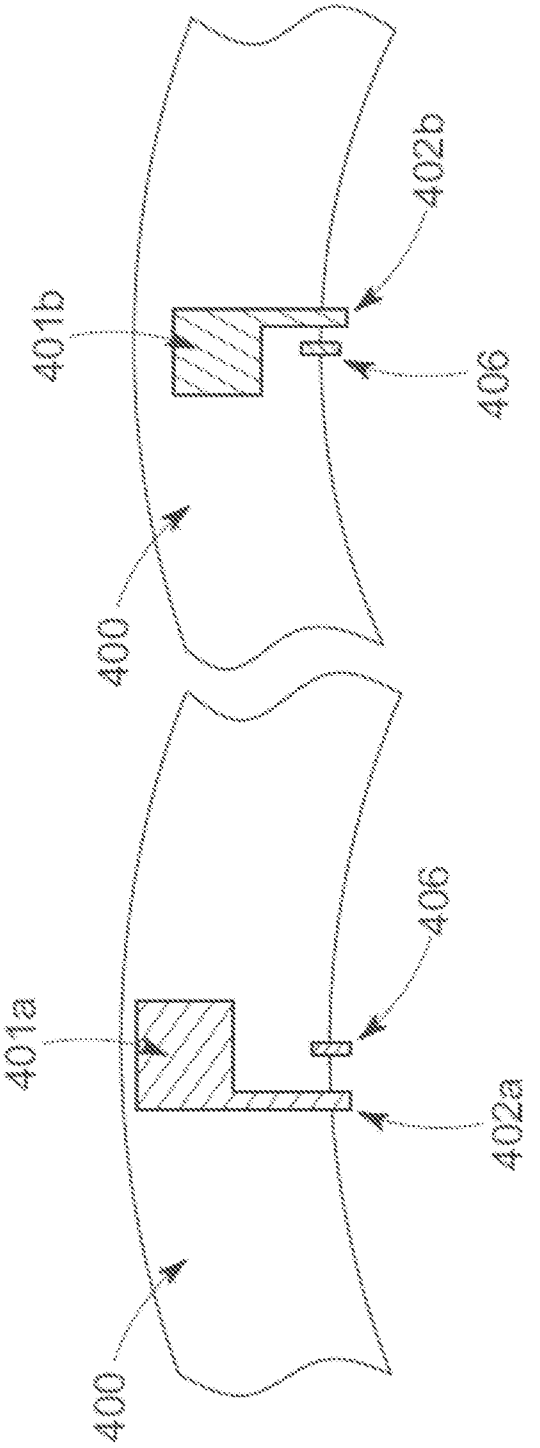
FIG. 4B is a top-down view of support features in a multi-station processing tool.
Figure 4C:
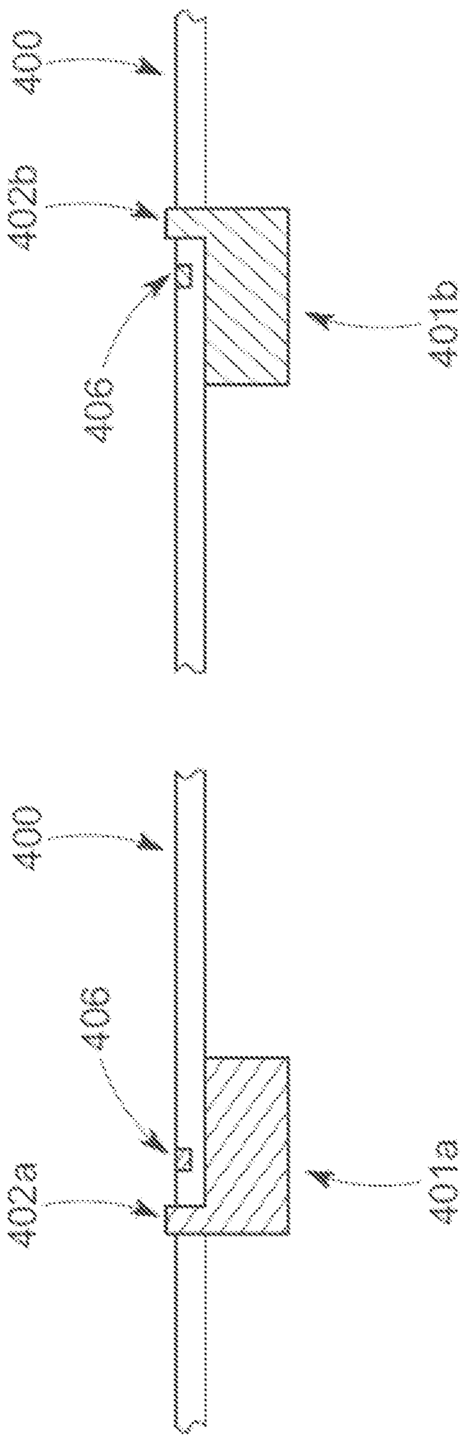
FIG. 4C is a side view of support features in a multi-station processing tool.

FIGS. 4A, 4B, and 4C respectively show bottom perspective views, bottom-up views, and side views of a wafer carrier ring 400 and station-varying support features 402*a* and 402*b*. As shown in FIG. 4A, a first processing station may have an element 401*a* having a first support feature 402*a*. FIG. 4A also shows how a second processing station may have an element 401*b* having a second support feature 402*b*. Elements 401*a* and 402*b* may be implementations of the spacers 130 of FIG. 1. Elements 401*a* and 401*b* and their associated support features 402*a* and 402*b* may be part of different processing stations in a multi-station processing tool such as the tools of FIGS. 2 and 3 (e.g., feature 402*a* may be present in a first station, while feature 402*b* may be present in a second station). In some embodiments, each processing station may have three or more support features to provide stability. Additionally, any number (all or just one, two, three, four, etc.) of the support features may be station-varying (e.g., engaging with the underside of the wafer at different locations, depending upon which station the wafer is at).

FIGS. 4A, 4B, and 4C also illustrate that, in some embodiments, wafer carrier ring 400 includes a plurality of wafer holding features 406 that supports a wafer or other substrate. When the wafer carrier ring 400 is lifted (e.g., for movement between stations or for a processing operation), the wafer holding features 406 may engage with the underside of a wafer. The wafer holding features 406 may be disposed along the inner perimeter of the wafer carrier ring 400 in sufficient number and with appropriate spacing to hold the wafer in a stable manner. In particular, there may be at least three wafer holding features 406 spaced sufficiently apart to maintain stability of a wafer. In other embodiments, an inner perimeter of the topside of the wafer carrier ring 400 may serve as a wafer holding feature (and features 406 may be optionally omitted).

As part of a backside deposition, the wafer carrier ring 400 may transport a wafer into a first processing station in a multi-station processing system. The wafer carrier ring 400 may be conveyed within the system by spider forks 132, paddles, or the like. The wafer carrier ring 400 may then be lowered (e.g., by lowering the spider forks) within the first station until the wafer rests upon a first set of wafer support features including feature 402*a*. A backside deposition process may then be performed within the first processing station. Subsequently, the wafer carrier ring 400 and wafer can be lifted, transported to a second processing station, and lowered within the second station until the wafer rests upon a second set of wafer support features including feature 402*b*. In such embodiments, the carrier ring 400 travels with the wafer from station-to-station and particular portions of station-specific support features, such as the support features 402*a* and 402*b*, contact the wafer apart from the carrier ring.

As shown in FIGS. 4A, 4B, and 4C; the support features such as feature 402*a* of the first processing station may be configured to hold a wafer at a first set of positions (which may be just to the left of the wafer holding feature 406 of the wafer carrier ring 400, in the manner of feature 402*a*). In contrast, the support features such as feature 402*b* of the second processing station may be configured to hold the wafer at a second set of positions (which may be just to the right of the wafer holding feature 406, in the manner of feature 402*b*). Because of this arrangement, backside deposition within the first processing station may be blocked at the first set of positions and backside deposition within the second processing station may be blocked at the second set of positions. However, because the first and second sets of positions are non-overlapping, backside deposition within the second processing station can at least partially fill any voids left by the blockage of support features such as feature 402*a*. Similarly, if backside deposition occurs in the first station after backside deposition in the second station, then backside deposition within the first station can at least partially fill any voids left by the blockage of support features such as feature 402*b*. With arrangements of these types, a backside film can be formed that is free of full-thickness voids. An example of these benefits is illustrated in FIG. 6.

Figure 6:
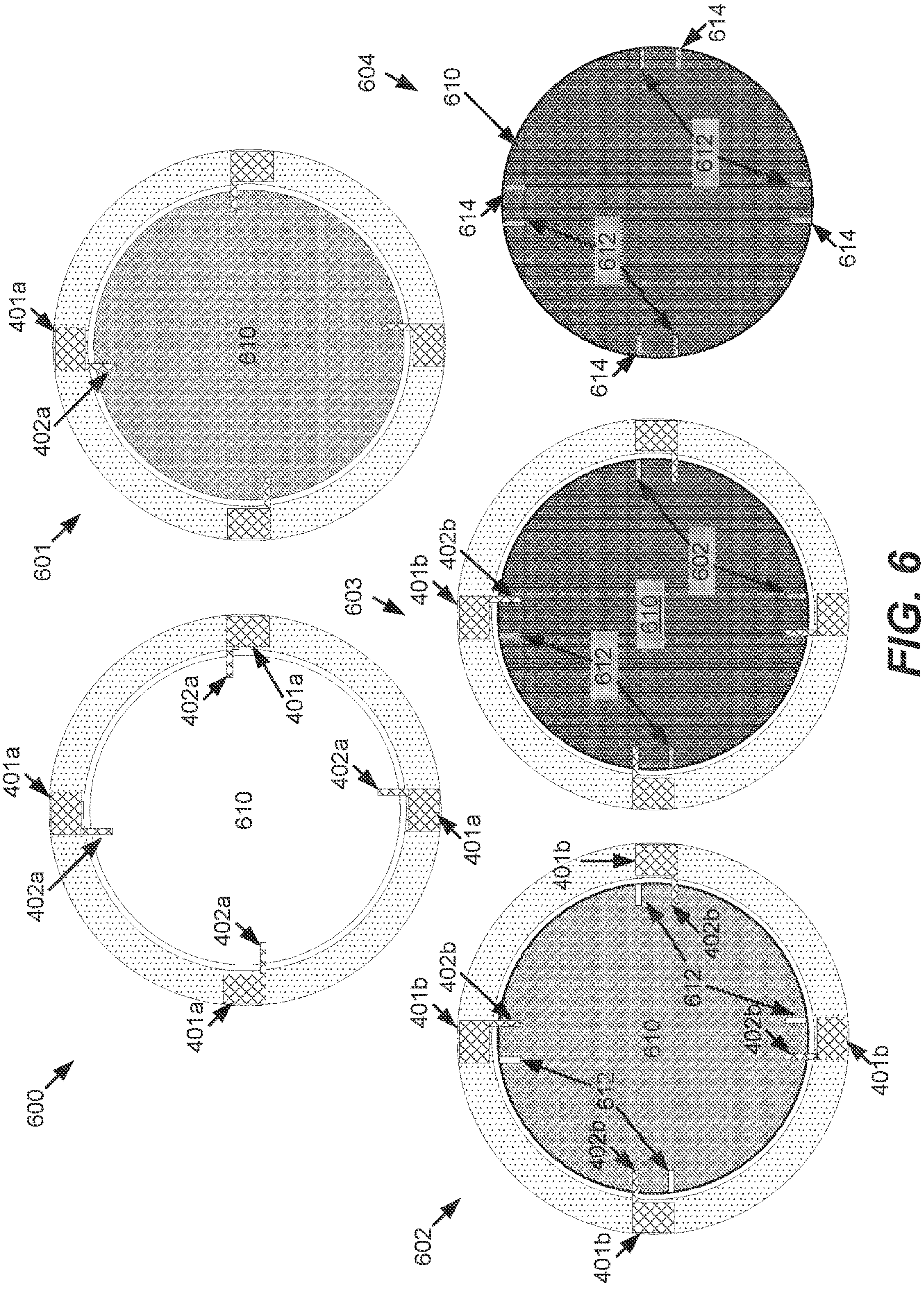
FIG. 6 illustrates various bottom-up views of a wafer being processed in a multi-station processing tool in accordance with certain disclosed embodiments.

FIG. 6 includes bottom-up images 600-604 of a wafer being processed in two stations of a multi-station processing tool. FIG. 6 is equally applicable to deposition processes, etch processes, and other fabrication processes, however the following discussion is described in terms of deposition for the sake of clarity and expediency.

Image 600 shows a wafer 610 supported by three or more support features 402*a* of a first processing station in a multi-station processing tool. Image 600 shows the wafer 610 prior to initial deposition of a film in the first processing station.

Image 601 shows the wafer 610 after the initial deposition of the film in the first processing station. The initial deposition of the film is indicated by a relatively light shading or stippling of wafer 610, relative to image 603.

Image 602 shows the wafer 610 after the wafer is transferred to a second processing station in the multi-station processing tool. Image 602 shows the wafer 610 prior to an additional deposition of a film in the second processing station. In the second processing station, the wafer 610 is supported by three or more support features 402*b*, which engage with the wafer 610 at different locations than support features 402*a*. Thus, the portions 612 of wafer 610 previously in contact with support features 402*a* are now uncovered and exposed when the wafer 610 is in the second processing station. As can be seen in image 602, the film deposited between images 600 and 601 was not deposited onto portions 612 of the wafer 610, as the support features 402 were blocking deposition onto portions 612.

Image 603 shows the wafer 610 after the additional deposition of the film in the second processing station. The additional deposition of the film is indicated by a relatively dark shading or stippling of wafer 610, relative to image 601. As shown in image 603, at least some thickness of film is deposited onto the portions 612, which were previously obscured by support features 402*a*. As indicated by the relatively light shading or stippling of portions 612 in image 603, the amount (e.g., thickness) of film deposited in portions 612 may be slightly less than the average amount (e.g., thickness) of film deposited across the wafer 610.

Image 604 shows the wafer 610 after the additional deposition of the film in the second processing station and with the support features 401*b* and other components removed for clarity. As shown in image 604, a relatively smaller (e.g., thinner) amount of film has been deposited on the portions 612 and 614 than was deposited across the remainder of the wafer 610. Images 600-604 thus illustrate how station-varying support features can avoid any full-thickness voids during deposition process. It is noted that similar results can be achieved in etching and other fabrication operations. As an example, when the techniques disclosed herein are applied in the etching context, the station-varying support features can avoid any areas from being completely unetched. Images 600-604 also illustrate how the support features 402*a* of the first processing station support the wafer 610 at a first set of positions, the support features 402*a* of the second processing station support the wafer at a second set of positions, and the first and second sets of positions are non-overlapping.

Figure 5:
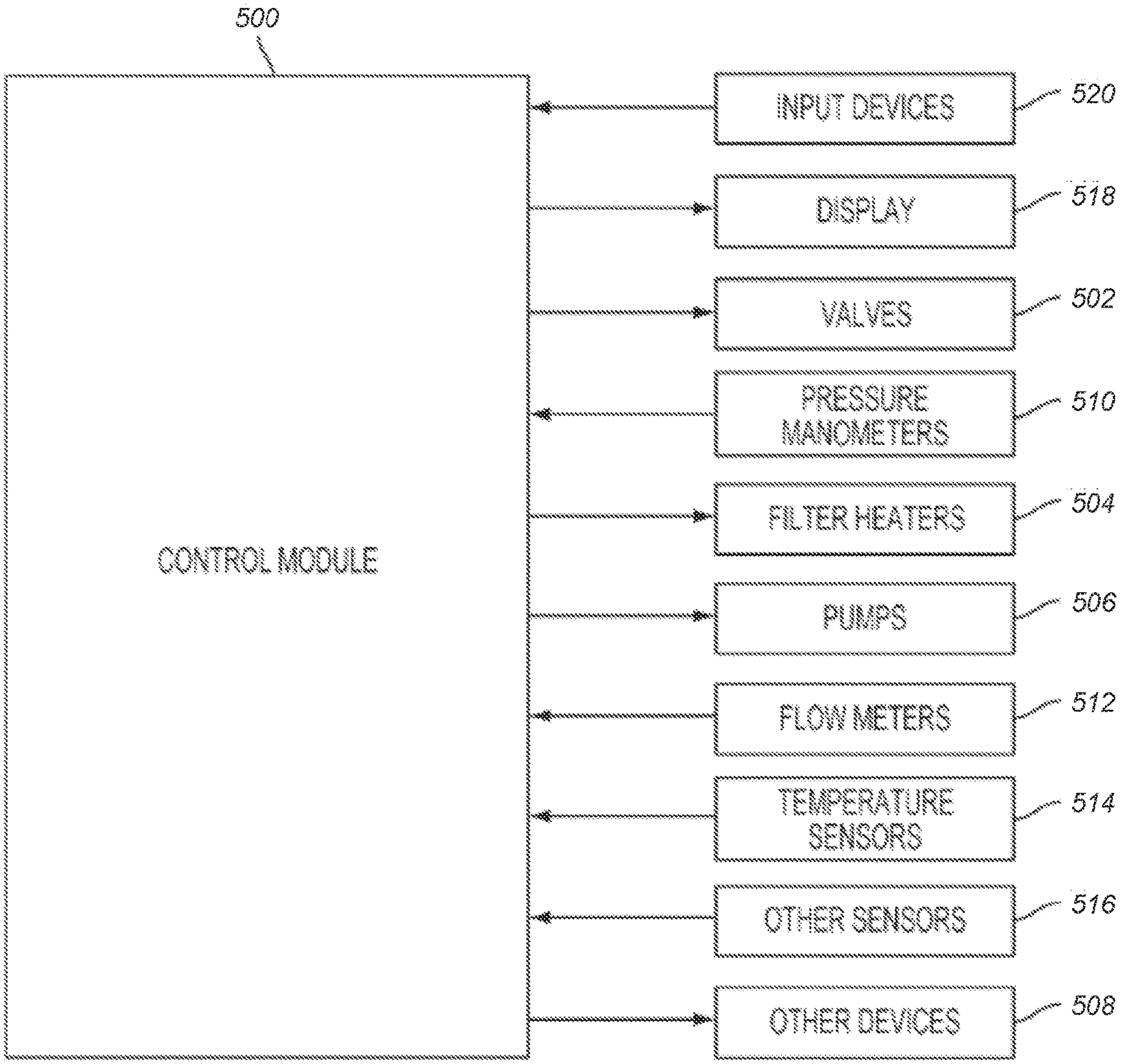
FIG. 5 is a schematic diagram of an example control module for controlling substrate processing systems in accordance with certain disclosed embodiments.

FIG. 5 shows a control module 500 for controlling the systems described above. In one embodiment, the control module 110 of FIG. 1 may include some of the example components. For instance, the control module 500 may include a processor, memory and one or more interfaces. The control module 500 may be employed to control devices in the system based in part on sensed values. For example only, the control module 500 may control one or more of valves 502, filter heaters 504, pumps 506, and other devices 508 based on the sensed values and other control parameters. The control module 500 receives the sensed values from, for example only, pressure manometers 510, flow meters 512, temperature sensors 514, and/or other sensors 516. The control module 500 may also be employed to control process conditions during precursor delivery and deposition of the film. The control module 500 will typically include one or more memory devices and one or more processors.

The control module 500 may control activities of the precursor delivery system and deposition apparatus. The control module 500 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 500 may also monitor the pressure differential and automatically switch vapor precursor delivery from one or more paths to one or more other paths. Other computer programs stored on memory devices associated with the control module 500 may be employed in some embodiments.

Typically there will be a user interface associated with the control module 500. The user interface may include a display 518 (e.g. a display screen and/or graphical software displays of the apparatus and/or process conditions), and user input devices 520 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 510, and thermocouples located in delivery system, the pedestal or chuck (e.g. the temperature sensors 514). Appropriately programmed feedback and control algorithms may be used with data from these sensors to maintain desired process conditions. The foregoing describes implementation of embodiments of the invention in a single or multi-chamber semiconductor processing tool.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

In this application, the terms "semiconductor wafer," wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving toward adoption of 450 mm diameter substrates. The description herein uses the terms “front” and “back” to describe the different sides of a wafer substrate. It is understood that the front side is where most deposition and processing occurs, and where the semiconductor devices themselves are fabricated. The back side is the opposite side of the wafer, which typically experiences minimal or no processing during fabrication.

The flow rates and power levels provided herein are appropriate for processing on 300 mm substrate, unless otherwise specified. One of ordinary skill in the art would appreciate that these flows and power levels may be adjusted as necessary for substrates of other sizes. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A multi-station plasma processing system, comprising:

a first processing station comprising a first set of support features configured to support a substrate at a first set of positions on a backside of the substrate when the substrate is processed at the first processing station; and a second processing station comprising a second set of support features configured to hold the substrate at a second set of positions on the backside of the substrate when the substrate is processed at the second processing station, wherein the first set of positions are non-overlapping with the second set of positions.

2. The multi-station plasma processing system of claim 1, wherein the first processing station further comprises a first shower-pedestal and wherein the second processing station further comprises a second shower-pedestal.

3. The multi-station plasma processing system of claim 2, wherein the first set of support features comprises first spacers configured to support the substrate in a first spaced apart relationship from the first shower-pedestal and wherein the second set of support features comprises second spacers configured to support the substrate in a second spaced apart relationship from the second shower-pedestal.

4. The multi-station plasma processing system of claim 2, wherein the first processing station further comprises a first gas manifold coupled to the first shower-pedestal and to provide a first gas from a first gas source when the substrate is processed at the first processing station and wherein the second processing station further comprises a second gas manifold coupled to the second shower-pedestal and to provide a second gas from a second gas source when the substrate is processed at the second processing station.

5. The multi-station plasma processing system of claim 2, further comprising at least one radio-frequency (RF) power supply configured to provide power to the first shower-pedestal to generate a plasma for depositing a first film on the backside while the substrate is supported by the first set of support features, wherein the at least one RF power supply is configured to provide power to the second shower-pedestal to generate an additional plasma for depositing a second film on the backside of the substrate while the substrate is supported by the second set of support features.

6. The multi-station plasma processing system of claim 5, wherein the first set of positions are non-overlapping with the second set of positions such that all of the backside of the substrate has deposited thereupon at least one of the first and second films.

7. The multi-station plasma processing system of claim 1, wherein the first set of support features and the second set of support features each comprise at least three support features spaced apart to support the substrate in a stable manner.

8. The multi-station plasma processing system of claim 1, further comprising:

at least one rotational indexer, the rotational indexer being configured transfer the substrate from the first processing station to the second processing station.

9. The multi-station plasma processing system of claim 1, further comprising:

at least one rotational indexer, the at least one rotational indexer being configured to lift a carrier ring such that the carrier ring engages with and lifts the substrate off of the first set of support features, transfer the carrier ring and the substrate from the first processing station to the second processing station, and lower the carrier ring such that the substrate rests on the second set of support features and the carrier ring disengages from the substrate.

10. A multi-station plasma processing system for processing a substrate having a nominal diameter of D, comprising:

a first processing station having a first set of support features;

a second processing station having a second set of support features; and an indexer configured to rotate about a center axis and to thereby transfer the substrate from the first processing station to the second processing station, wherein:

the first set of support features are positioned within a first circular region having the nominal diameter of D and centered on a first center point of the first processing station, the second set of support features are positioned within a second circular region having the nominal diameter of D and centered on a second center point of the second processing station, and the first set of support features are azimuthally offset with respect to the second set of support features.

11. The multi-station plasma processing system of claim 10, wherein the first processing station further comprises a first shower-pedestal and wherein the second processing station further comprises a second shower-pedestal.

12. The multi-station plasma processing system of claim 11, wherein the first set of support features comprises first spacers configured to support the substrate in a first spaced apart relationship from the first shower-pedestal and wherein the second set of support features comprises second spacers configured to support the substrate in a second spaced apart relationship from the second shower-pedestal.

13. The multi-station plasma processing system of claim 10, wherein the first set of support features and the second set of support features each comprise at least three support features spaced apart to support the substrate in a stable manner.

14. The multi-station plasma processing system of claim 10, wherein the first processing station comprises first equipment for depositing a first film on a backside of the substrate and wherein the second processing station comprises second equipment for depositing a second film on the backside of the substrate.

15. The multi-station plasma processing system of claim 14, wherein the first set of support features are configured to contact the backside of the substrate at a first set of backside positions, wherein the second set of support features are configured to contact the backside of the substrate at a second set of backside positions, wherein the first set of support features block deposition of the first film at the first set of backside positions, and wherein the second set of support features permit deposition of the second film at the first set of backside positions.

16. The multi-station plasma processing system of claim 15, wherein the first set of support features permit deposition of the first film at the second set of backside positions, and wherein the second set of support features block deposition of the second film at the second set of backside positions.

* * * * *